(12) United States Patent
Tamaki et al.

(10) Patent No.: US 10,818,707 B2
(45) Date of Patent: *Oct. 27, 2020

(54) SOLID-STATE IMAGING DEVICE

(71) Applicant: PANASONIC INTELLECTUAL PROPERTY MANAGEMENT CO., LTD., Osaka (JP)

(72) Inventors: Tokuhiko Tamaki, Osaka (JP); Hirohisa Ohtsuki, Hyogo (JP); Ryohei Miyagawa, Kyoto (JP); Motonori Ishii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/130,664

(22) Filed: Sep. 13, 2018

(65) Prior Publication Data

US 2019/0013340 A1 Jan. 10, 2019

Related U.S. Application Data

(60) Continuation of application No. 15/487,941, filed on Apr. 14, 2017, now Pat. No. 10,103,181, which is a
(Continued)

(30) Foreign Application Priority Data

Jun. 25, 2012 (JP) ................................ 2012-142469

(51) Int. Cl.
*H01L 27/146* (2006.01)
*H04N 5/3745* (2011.01)
*H04N 5/369* (2011.01)

(52) U.S. Cl.
CPC .. *H01L 27/14603* (2013.01); *H01L 27/14609* (2013.01); *H01L 27/14612* (2013.01);
(Continued)

(58) Field of Classification Search
CPC combination set(s) only.
See application file for complete search history.

(56) References Cited

U.S. PATENT DOCUMENTS 6,018,187 A    1/2000  Theil et al.
8,653,566 B2   2/2014  Ohtsuki
(Continued)

FOREIGN PATENT DOCUMENTS

JP    2000-133792 A    5/2000
JP    2002-050752 A    2/2002
(Continued)

OTHER PUBLICATIONS

International Search Report issued in PCT/JP2013/003186, dated Aug. 6, 2013, with English translation.
(Continued)

*Primary Examiner* — Bitew A Dinke
(74) *Attorney, Agent, or Firm* — McDermott Will & Emery LLP

(57) ABSTRACT

A solid-state imaging device includes: pixels arranged in a matrix; a vertical signal line provided for each column, conveying a pixel signal; a power line provided for each column, proving a power supply voltage; and a feedback signal line provided for each column, conveying a signal from a peripheral circuit to a pixel, in which each of the pixels includes: an N-type diffusion layer; a photoelectric conversion element above the N-type diffusion layer; and a charge accumulation node between the N-type diffusion layer and the photoelectric conversion element, accumulating signal charge generated in the photoelectric conversion
(Continued)

element, the feedback signal line, a metal line which is a part of the charge accumulation node, the vertical signal line, and the power line are disposed in a second interconnect layer, and the vertical signal line and the power line are disposed between the feedback signal line and the metal line.

12 Claims, 15 Drawing Sheets

Related U.S. Application Data division of application No. 14/554,450, filed on Nov. 26, 2014, now Pat. No. 9,653,510, which is a continuation of application No. PCT/JP2013/003186, filed on May 20, 2013.

(52) U.S. Cl.
CPC .. *H01L 27/14636* (2013.01); *H01L 27/14643* (2013.01); *H04N 5/3745* (2013.01); *H04N 5/3698* (2013.01)

(56) References Cited

U.S. PATENT DOCUMENTS

| | | | |
|---|---|---|---|
| 8,659,688 B2 | 2/2014 | Wakano et al. | |
| 9,344,654 B2* | 5/2016 | Ishii | H04N 5/3698 |
| 9,402,040 B2* | 7/2016 | Takase | H04N 5/369 |
| 9,653,510 B2* | 5/2017 | Tamaki | H04N 5/3745 |
| 9,825,072 B2* | 11/2017 | Ohtsuki | H04N 5/3745 |
| 10,103,181 B2* | 10/2018 | Tamaki | H04N 5/3745 |
| 2005/0237405 A1* | 10/2005 | Ohkawa | H01L 27/14609 348/308 |
| 2007/0001148 A1* | 1/2007 | Adachi | G02F 1/136277 252/299.63 |
| 2007/0069258 A1* | 3/2007 | Ahn | H01L 27/14634 257/290 |
| 2009/0184349 A1 | 7/2009 | Dungan | |
| 2010/0060764 A1* | 3/2010 | McCarten | H01L 27/14634 348/308 |
| 2011/0096215 A1* | 4/2011 | Choi | H01L 27/14632 348/294 |
| 2011/0128400 A1 | 6/2011 | Wakano et al. | |
| 2011/0156195 A1* | 6/2011 | Tivarus | H01L 27/14603 257/443 |
| 2011/0156197 A1 | 6/2011 | Tivarus et al. | |
| 2011/0291220 A1* | 12/2011 | Yoshida | H01L 27/14603 257/461 |
| 2012/0200752 A1 | 8/2012 | Matsunaga | |
| 2013/0001650 A1 | 1/2013 | Ohtsuki | |
| 2013/0075591 A1* | 3/2013 | Otake | H01L 27/14623 250/208.1 |
| 2013/0092822 A1* | 4/2013 | Ichikawa | H01L 27/14645 250/208.1 |
| 2013/0099291 A1* | 4/2013 | Shimotsusa | H01L 27/14609 257/225 |
| 2013/0099343 A1* | 4/2013 | Toshikiyo | H01L 27/14625 257/432 |
| 2013/0105924 A1* | 5/2013 | Kobayashi | H01L 27/14632 257/431 |
| 2013/0107095 A1* | 5/2013 | Yarino | H01L 27/14609 348/302 |
| 2013/0113060 A1* | 5/2013 | Matsunaga | H01L 27/14632 257/431 |
| 2013/0141617 A1* | 6/2013 | Soda | H01L 27/14636 348/294 |
| 2013/0284885 A1* | 10/2013 | Chen | H01L 25/16 250/208.1 |
| 2013/0292548 A1 | 11/2013 | Agranov et al. | |
| 2013/0314574 A1* | 11/2013 | Ishii | H01L 27/1461 348/302 |
| 2013/0341491 A1* | 12/2013 | Hirose | H01L 27/1464 250/208.1 |
| 2014/0043510 A1 | 2/2014 | Kasuga et al. | |
| 2014/0103400 A1 | 4/2014 | Sakata et al. | |
| 2014/0118593 A1 | 5/2014 | Wakano et al. | |
| 2015/0084106 A1* | 3/2015 | Nakanishi | H01L 27/1461 257/292 |
| 2016/0105622 A1 | 4/2016 | Tamaki | |
| 2016/0191825 A1* | 6/2016 | Sato | H04N 5/363 348/250 |
| 2016/0293654 A1 | 10/2016 | Tomekawa et al. | |

FOREIGN PATENT DOCUMENTS

| | | |
|---|---|---|
| JP | 2005-244355 A | 9/2005 |
| JP | 2005-268384 A | 9/2005 |
| JP | 2011-114324 A | 6/2011 |
| JP | 2011-199185 A | 10/2011 |
| JP | 2012-019168 A | 1/2012 |
| JP | 2012-019169 A | 1/2012 |
| WO | 2012/005011 A1 | 1/2012 |
| WO | 2012/005014 A1 | 1/2012 |
| WO | 2012/117670 A1 | 9/2012 |
| WO | WO-2012117670 A1 * | 9/2012 ......... H01L 27/1464 |

OTHER PUBLICATIONS

U.S. Office Action dated Dec. 4, 2015 issued in U.S. Appl. No. 14/554,450.

U.S. Final Office Action dated Apr. 15, 2016 issued in U.S. Appl. No. 14/554,450.

U.S. Final Office Action dated Jul. 28, 2016 issued in U.S. Appl. No. 14/554,450.

U.S. Notice of Allowance dated Jan. 11, 2017 issued in U.S. Appl. No. 14/554,450.

U.S. Office Action dated Oct. 18, 2017 issued in U.S. Appl. No. 15/487,941.

U.S. Office Action dated Jan. 10, 2018 issued in U.S. Appl. No. 15/487,941.

U.S. Notice of Allowance dated Jun. 26, 2018 issued in U.S. Appl. No. 15/487,941.

\* cited by examiner

SOLID-STATE IMAGING DEVICE

CROSS REFERENCE TO RELATED APPLICATIONS

This is a continuation application of U.S. patent application Ser. No. 15/487,941, filed on Apr. 14, 2017, which is a divisional application of U.S. patent application Ser. No. 14/554,450 filed on Nov. 26, 2014, now U.S. Pat. No. 9,653,510, issued May 16, 2017, which is a continuation application of PCT International Application No. PCT/JP2013/003186 filed on May 20, 2013, designating the United States of America, which is based on and claims priority of Japanese Patent Application No. 2012-142469 filed on Jun. 25, 2012. The entire disclosures of the above-identified applications, including the specifications, drawings and claims are incorporated herein by reference in their entireties.

FIELD

One or more exemplary embodiments disclosed herein relate generally to solid-state imaging devices, and particularly relate to a pixel circuit layout adaptable to an increase in the number of pixels.

BACKGROUND

In recent years, CMOS image sensors easily adaptable to common semiconductor manufacturing techniques have become mainstream in the field of image sensors, and the number of pixels is being further increased and the sensitivity is becoming higher. Like a CCD image sensor, a CMOS image sensor uses a photodiode formed in a silicon substrate, as a photoelectric conversion element. In this case, a reduction in pixel size with an increase in the number of pixels exposes the problem that the incident photon-to-current conversion efficiency is degraded due to an interconnect layer located above the photodiode.

For this reason, Patent Literature (PTL) 1 (Japanese Unexamined Patent Application Publication No. 2012-19169) proposes a new image sensor (photoelectric conversion film layered image sensor) in which the photoelectric conversion element (photoelectric conversion film) is formed on lines instead of in the silicon substrate.

SUMMARY

Technical Problem

The photoelectric conversion film layered image sensor as described above has to transmit signal charge generated in a photoelectric conversion element to a diode junction in a silicon substrate to store the signal charge. In a conventional MOS sensor including a photodiode (PD), it is possible to move (thoroughly transfer) all the signal charge in the photodiode to an accumulation diode, whereas in the photoelectric conversion film layered image sensor, it is difficult to thoroughly transfer the signal charge due to thermodynamic noise, i.e. kTC noise, generated in a transmission or a reset.

PTL 1 also proposes a feedback circuit, a pixel structure, and others for cancelling out the thermodynamic noise of the photoelectric conversion film layered image sensor. While a pixel is further scaled down, however, it has been found that for fine pixel size of 3 μm or less, the employment of the feedback circuit is not enough to exactly cancel out the noise. In particular, the feedback is performed on a row-by-row basis like read-out of a signal, and after the end of the feedback operation for a row, a feedback signal voltage changes for the feedback operation for the following rows. There is, however, a finite coupling capacitance between a line node to which the feedback signal voltage is applied and a charge accumulation node. Therefore, the change in the feedback signal voltage is reflected into the charge accumulation node through the coupling capacitance, which causes an error.

Solution to Problem

In order to solve the aforementioned problem, a solid-state imaging device according to one aspect disclosed herein includes: a plurality of pixels arranged in columns and rows, each of the pixels generating a pixel signal according to incident light; a main signal line provided for each of the columns, the main signal line conveying the pixel signal to a peripheral circuit; a power line provided for each of the columns, the power line providing a power supply voltage to each of the pixels belonging to the column; and a feedback signal line provided for each of the columns, the feedback signal line conveying each feedback signal from the peripheral circuit to a different one of the pixels belonging to the column, in which each of the pixels includes: a photoelectric conversion element disposed above a substrate, the photoelectric conversion element converting the incident light into signal charge; a diffusion layer disposed between the substrate and the photoelectric conversion element, the diffusion layer being included in an amplifier transistor which provides a voltage according to the signal charge and a reset transistor which resets a gate terminal of the amplifier transistor; and a charge accumulation node disposed between the diffusion layer and the photoelectric conversion element, the charge accumulation node being a line electrically connecting the diffusion layer and the photoelectric conversion element and accumulating the signal charge, and the feedback signal line, a metal line which is a part of the charge accumulation node, and at least one of the main signal line and the power line are disposed in a same layer, and the at least one of the main signal line and the power line is disposed between the feedback signal line and the metal line.

Furthermore, a solid-state imaging device according to one aspect disclosed herein includes: a plurality of pixels arranged in columns and rows, each of the pixels generating a pixel signal according to incident light; a main signal line provided for each of the columns, the main signal line conveying the pixel signal to a peripheral circuit and also conveying a feedback signal corresponding to the pixel signal to each of the pixels belonging to the column; a power line provided for each of the columns, the power line providing a power supply voltage to each of the pixels belonging to the column; and in which each of the pixels includes: a photoelectric conversion element disposed above a substrate, the photoelectric conversion element converting the incident light into signal charge; a diffusion layer disposed between the substrate and the photoelectric conversion element, the diffusion layer being included in an amplifier transistor which provides a voltage according to the signal charge and a reset transistor which resets a gate terminal of the amplifier transistor; and a charge accumulation node disposed between the diffusion layer and the photoelectric conversion element, the charge accumulation node being a line electrically connecting the diffusion layer and the photoelectric conversion element and accumulating the signal charge, and the main signal line, a metal line which is a part of the charge accumulation node, and the power line are disposed in a same layer, and the power line is disposed between the main signal line and the metal line.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, certain exemplary embodiments are described in greater detail with reference to the accompanying Drawings.

Embodiment 1

Figure 1:
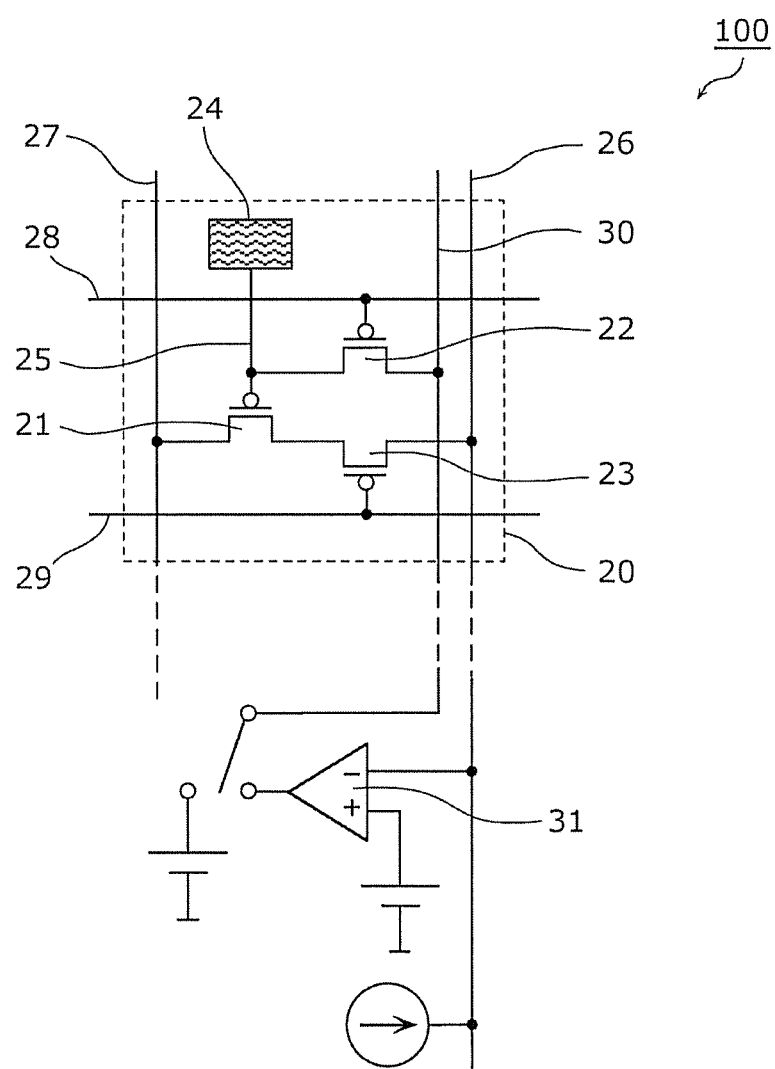
FIG. 1 illustrates a circuit structure of a solid-state imaging device according to Embodiment 1.
Figure 2:
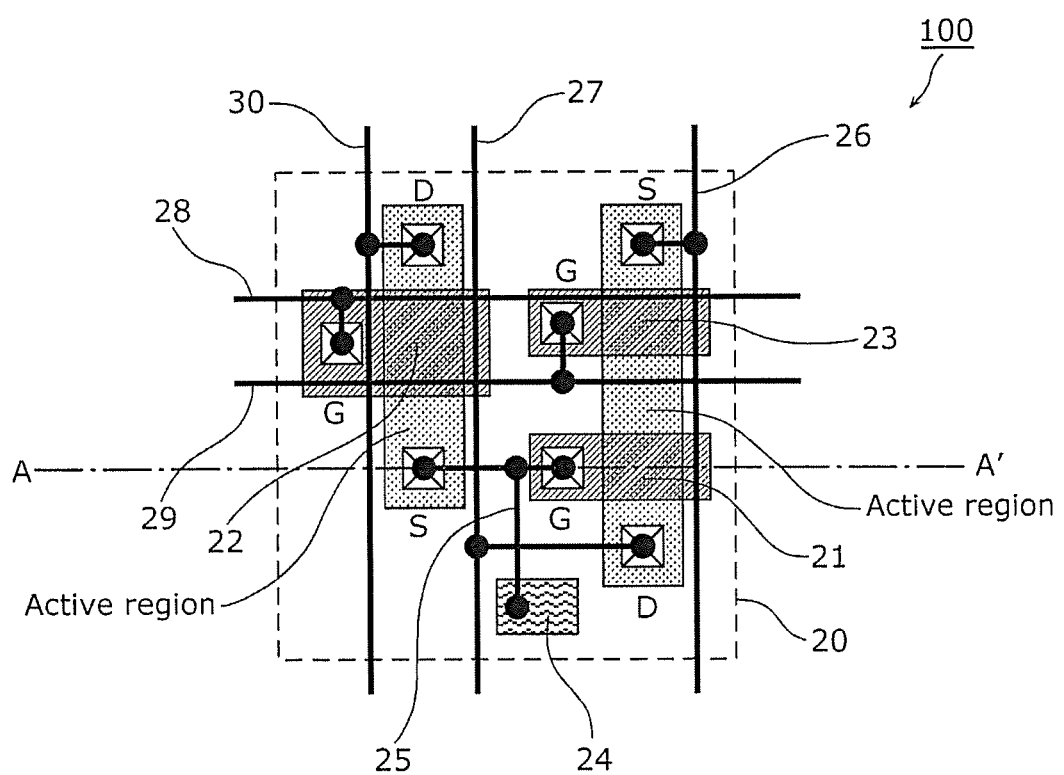
FIG. 2 illustrates a planar layout of a unit pixel of the solid-state imaging device according to Embodiment 1.

FIG. 1 illustrates a circuit structure of a solid-state imaging device according to Embodiment 1. Furthermore, FIG. 2 illustrates a planar layout of a unit pixel of the solid-state imaging device according to Embodiment 1.

The solid-state imaging device 100 according to Embodiment 1 includes a pixel array in which unit pixels 20 are arranged in columns and rows. The unit pixel 20 shown in FIG. 1 includes an amplifier transistor 21, a reset transistor 22, an address transistor 23, a photoelectric conversion element 24, and lines connecting them, and generates a pixel signal according to incident light.

The amplifier transistor 21 has a source connected to a power line 27 running vertically. The reset transistor 22 has a gate connected to a reset signal line 28 running horizontally, and a source connected to a feedback signal line 30 running vertically. The address transistor 23 has a gate connected to an address signal line 29 running horizontally, and a drain connected to a vertical signal line 26 running vertically.

The vertical signal line 26 is provided for each column, and conveys a pixel signal to a peripheral circuit as a main signal line. The power line 27 is provided for each column, and provides a power voltage to the unit pixel 20 belonging to the column. The feedback signal line 30 is provided for each column, and conveys a feedback signal from the peripheral circuit to the unit pixel 20 belonging to the column.

The signal charge generated by the photoelectric conversion element 24 in the unit pixel 20 is converted into a voltage by a charge accumulation node 25, amplified by the amplifier transistor 21, and provided to the vertical signal line 26 as the pixel signal. After reading out the pixel signal, the charge accumulated in the charge accumulation node 25 is reset. Here, in order to cancel out residual random noise component after the reset in the accumulated charge, a set of the feedback signal line 30 and a feedback amplifier 31 is provided. The feedback amplifier 31 has a negative input terminal connected to the vertical signal line 26, and an output terminal connected to the feedback signal line 30 via a switch.

In this structure, when the charge accumulated in the charge accumulation node 25 is reset by the reset transistor 22 (the reset transistor 22 is turned on), the random noise generated in the charge accumulation node 25 is negatively fed back to the source of the reset transistor 22 through the amplifier transistor 21, the address transistor 23, the vertical signal line 26, the feedback amplifier 31 which is a part of the peripheral circuit, and the feedback signal line 30. In this way, the noise component in the charge accumulation node 25 is cancelled out, thereby reducing random noise.

In the photoelectric conversion film layered image sensor, random noise is generated during the transmission or reset of the signal charge. The residual random noise after the reset is added to the next signal charge to be accumulated. Accordingly, when reading out the next signal charge, a signal with the residual random noise is provided. In view of this, the solid-state imaging device 100 according to Embodiment 1 includes a feedback circuit to remove the residual random noise, detects a random noise signal output from each unit pixel, and feeds back to the unit pixel so as to cancel out the random noise component in the accumulated charge.

Next, the layout of the unit pixel 20 according to Embodiment 1 is described. The unit pixel 20 is implemented as a fine cell having a size of 0.9 μm×0.9 μm for example. As shown in FIG. 2, the amplifier transistor 21 and the address transistor 23 are connected in series in the same active region. The drain of the amplifier transistor 21 is connected to the power line 27, and the source of the address transistor 23 is connected to the vertical signal line 26. The reset transistor 22 is formed on an active region different from that of the amplifier transistor 21 and the address transistor 23, and the drain of the reset transistor 22 is connected to the feedback signal line 30. The gate of the address transistor 23 is connected to the address signal line 29 running horizontally, and the gate of the reset transistor 22 is connected to the reset signal line 28 running horizontally. The source of the reset transistor 22, the gate of the amplifier transistor 21, and the photoelectric conversion element 24 are connected with line, and they constitute the charge accumulation node 25. According to the foregoing layout of each transistor and the photoelectric conversion element, the circuit structure as shown in FIG. 2 is achieved. The signal charge generated by the photoelectric conversion element 24 is converted into a voltage by a charge accumulation node 25, and amplified by the amplifier transistor 21.

In the next section, the solid-state imaging device 100 according to Embodiment 1 is described with reference to a comparison example for the sake of better understanding of the features.

Figure 9:
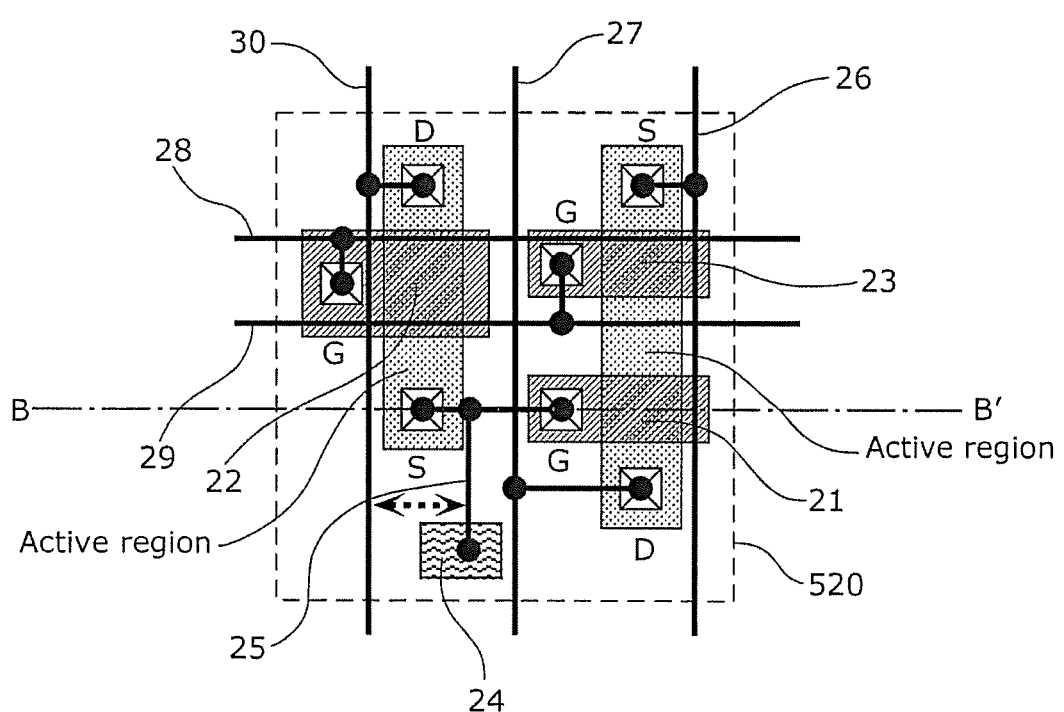
FIG. 9 illustrates a planar layout of a unit pixel according to a comparison example.

FIG. 9 illustrates a planar layout of a unit pixel according to the comparison example. In the unit pixel 520 shown in FIG. 9, a feedback signal line 30 connected to the drain of a reset transistor 22 and a charge accumulation node 25 connected to a source of the reset transistor 22 are adjacent to each other. In the conventional layout shown in FIG. 9, in order to enhance a conversion gain for signal charge generated by a photoelectric conversion element 24, the feedback signal line 30 and the charge accumulation node 25 are adjacent to each other so as to minimize the length of line to reduce the capacitance of the charge accumulation node 25. In this case, however, the line-to-line coupling capacitance between the feedback signal line 30 and the charge accumulation node 25 is large. In other words, in the pixel layout of FIG. 9, due to the pixel structure, the coupling capacitance between the feedback signal line 30 and the charge accumulation node 25 causes an error.

In contrast, in the unit pixel 20 of the solid-state imaging device according to Embodiment 1, as shown in FIG. 2, the charge accumulation node 25 connecting the source of the reset transistor 22, the gate of the amplifier transistor 21, and the photoelectric conversion element 24 is disposed on the opposite side of the feedback signal line 30 with respect to the power line 27. Accordingly, it is possible to prevent an increase in the line-to-line coupling capacitance between the charge accumulation node 25 and the feedback signal line 30.

A cross-section structure of the foregoing pixel layout is described with reference to FIG. 3A.

Figure 3A:
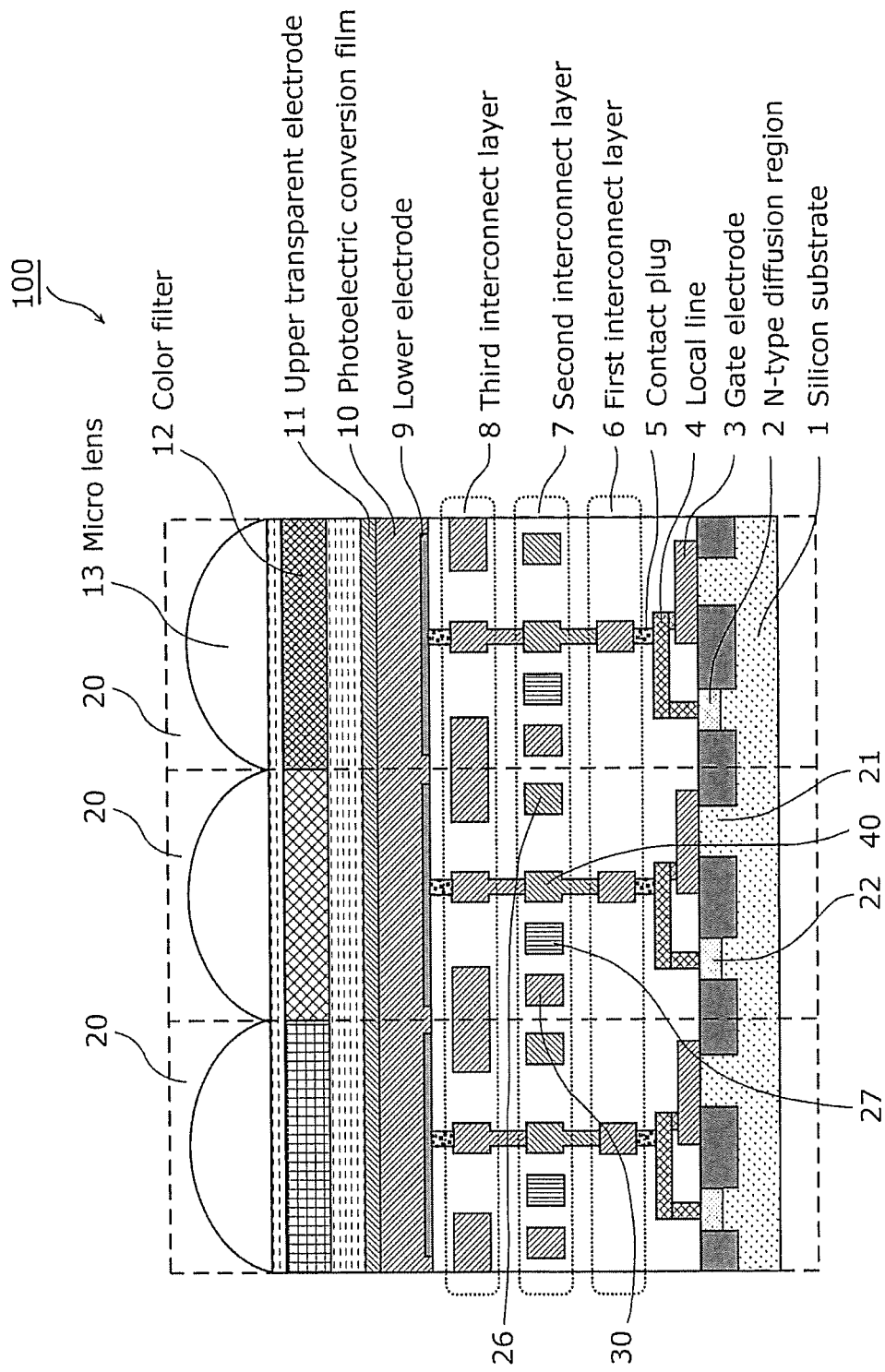
FIG. 3A illustrates a cross-sectional view of a pixel array in the solid-state imaging device according to Embodiment 1.

FIG. 3A illustrates a cross-sectional view of the pixel array in the solid-state imaging device according to Embodiment 1. FIG. 3A is a cross-sectional view of the planar layout in FIG. 2 along the line A-A'. As shown in FIG. 3A, an n-type diffusion region 2 is formed in a p-type silicon substrate 1, and included in a diffusion layer included in the amplifier transistor 21 and the reset transistor 22. A local line 4 is formed on the n-type diffusion region 2, and connects a gate electrode 3 of the amplifier transistor 21 and the source of the reset transistor. It is to be noted that in FIG. 3A, the local line 4 is composed of n-type polysilicon for example. The photoelectric conversion element 24 described in FIG. 1 and FIG. 2 is formed above the n-type diffusion region 2, and includes a lower electrode 9, the photoelectric conversion film 10 composed of an organic material, and an upper transparent electrode 11. When positive bias voltage is applied to the upper transparent electrode 11, holes move toward the lower electrode 9. The holes are of pairs of electrons and holes which are generated in the photoelectric conversion film 10 from incident light passing through the micro lens 13 and the color filter 12. The holes are collected in the lower electrode 9 on a per unit pixel 20 basis, and efficiently accumulated in the charge accumulation node 25 composed of the third interconnect layer 8 of Cu, the second interconnect layer 7 of Cu, the first interconnect layer 6 of Cu, a contact plug 5, the n-type diffusion region 2 serving as the source of the reset transistor 22 formed in the silicon substrate 1, the gate electrode 3 serving as the gate of the amplifier transistor 21 formed on the silicon substrate 1, and the local line 4. In other words, the charge accumulation node 25 disposed between the n-type diffusion region 2 and the photoelectric conversion element 24 is a line electrically connecting the n-type diffusion region 2 and the photoelectric conversion element 24, and accumulates the signal charge.

The vertical signal line 26, the power line 27, and the feedback signal line 30 are all disposed in the same direction in the second interconnect layer 7. In this layout, the power line 27 is disposed between a metal line 40 which is a part of the charge accumulation node 25 located in the second interconnect layer 7 and the feedback signal line 30 disposed in the same unit pixel as the metal line 40. In order to ensure this, the contact point between the contact plug 5 and the local line 4 is away from the feedback signal line 30. In this way, a space is reserved for the power line 27 disposed between the metal line 40 and the feedback signal line 30 in the same unit pixel 20. Accordingly, the line-to-line coupling capacitance between the metal line 40 and the feedback signal line 30 is reduced. Furthermore, the vertical signal line 26 is disposed between the metal line 40 and another feedback signal line 30 disposed in the adjacent unit pixel. In other words, the feedback signal line 30, the metal line 40 which is a part of the charge accumulation node 25, the vertical signal line 26, and the power line 27 are disposed in the same second interconnect layer 7, and each of the vertical signal line 26 and the power line 27 is disposed between the feedback signal line 30 and the metal line 40.

Figure 3B:
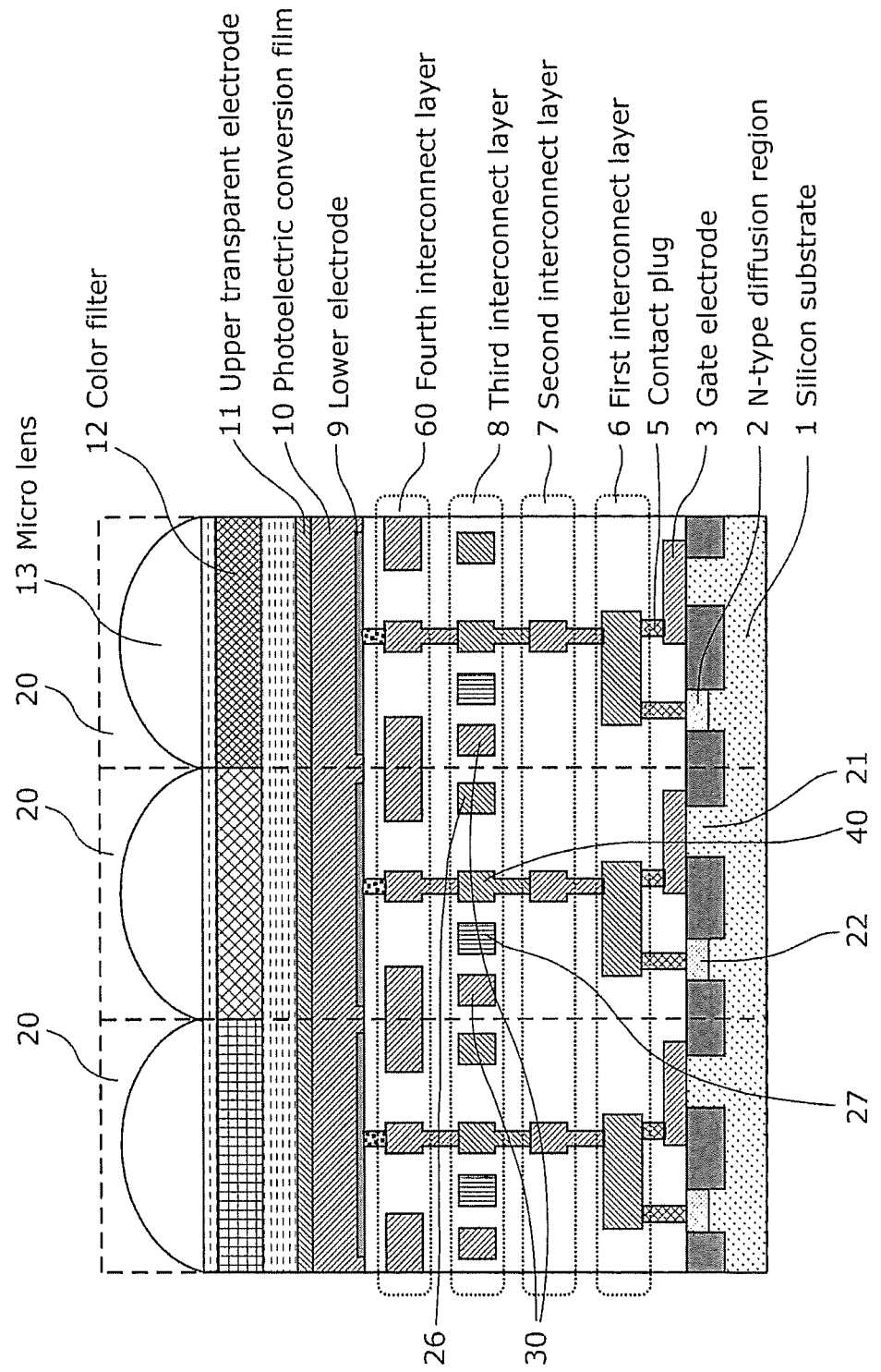
FIG. 3B illustrates a first variation of the cross-sectional view of the pixel array in the solid-state imaging device according to Embodiment 1.
Figure 3C:
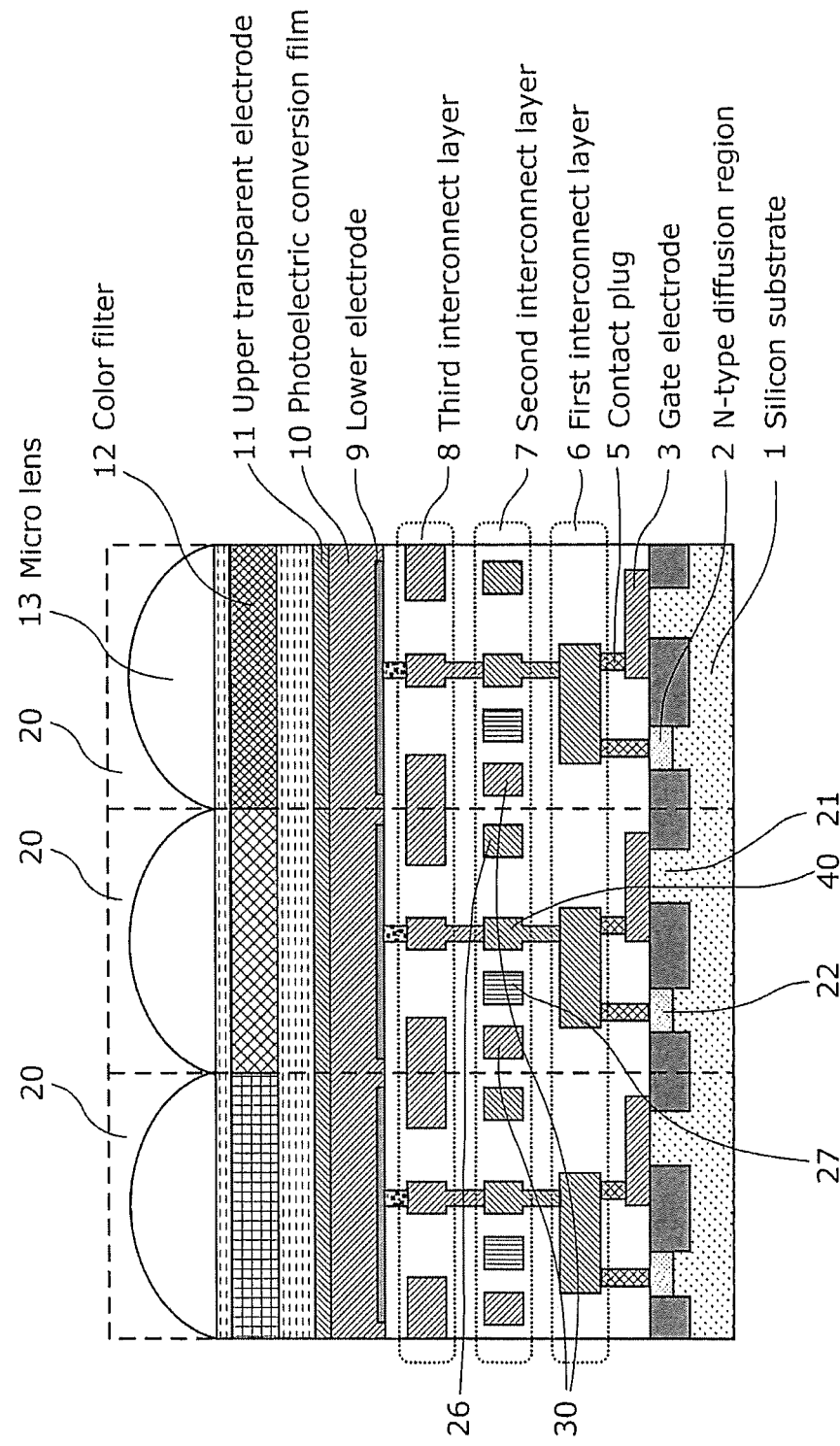
FIG. 3C illustrates a second variation of the cross-sectional view of the pixel array in the solid-state imaging device according to Embodiment 1.

It is to be noted that, in FIG. 3A according to Embodiment 1, an n-type polysilicon local line 4 is used to connect the gate electrode 3 of the amplifier transistor 21 and the source of the reset transistor 22, and the feedback signal line 30 and the power line 27 are reversed. The local line 4 is made of the n-type polysilicon because the local line 4 is provided in the pixel and it does not matter how high the line resistance is. In contrast, when priority is given to the line resistance issue, as shown in FIG. 3B illustrating the first variation of Embodiment 1, or FIG. 3C illustrating the second variation of Embodiment 1, Cu interconnect layers are increased in the same manner as the upper interconnect layers, and the lowest first interconnect layer 6 may be used as a line connecting the gate electrode 3 of the amplifier transistor 21 and the source of the reset transistor 22. In the structure of FIG. 3B, four interconnect layers including the fourth interconnect layer 60 are provided between the diffusion layer and the photoelectric conversion element. Furthermore, in the structure of FIG. 3C, the line and the feedback signal line 30 are disposed in interconnect layers stacked between the diffusion layer and the photoelectric conversion element.

In the next section, the solid-state imaging device 100 according to Embodiment 1 is described with reference to a comparison example shown in FIG. 10.

Figure 10:
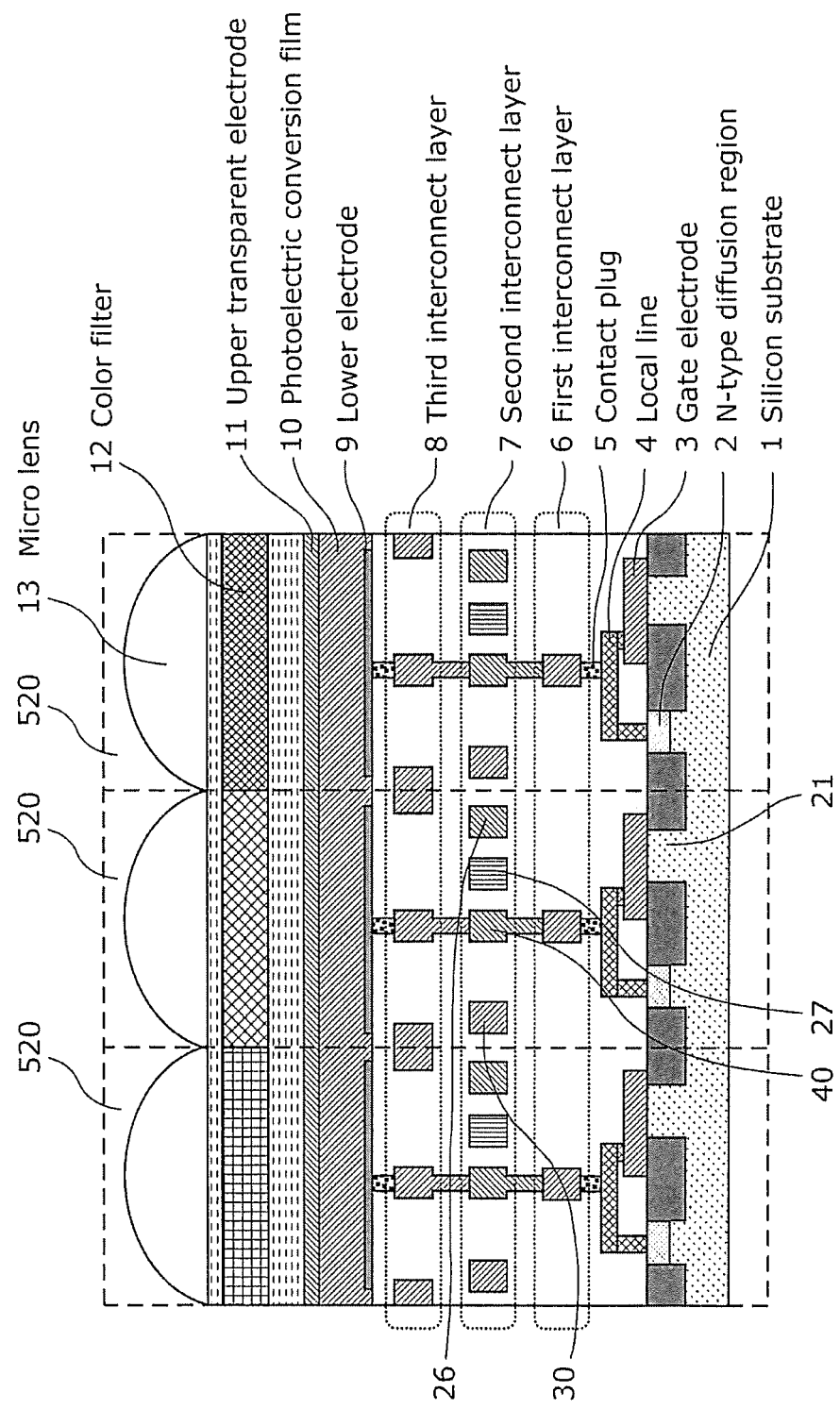
FIG. 10 illustrates a cross-sectional view of a pixel array according to the comparison example.

FIG. 10 illustrates a cross-sectional view of a pixel array according to the comparison example. FIG. 10 is a cross-sectional view of the planar layout of the unit pixel 520 shown in FIG. 9 along the line B-B'. Like the cross-sectional view in FIG. 3A, the vertical signal line 26, the power line 27, and the feedback signal line 30 are all disposed in the same direction in the second interconnect layer 7. However, the metal line 40 and the feedback signal line 30 disposed in the same unit pixel 520 are adjacent to each other. In such a relation between the metal line 40 and the feedback signal line 30, the line-to-line coupling capacitance between the metal line 40 and the feedback signal line 30 is large.

Figure 4:
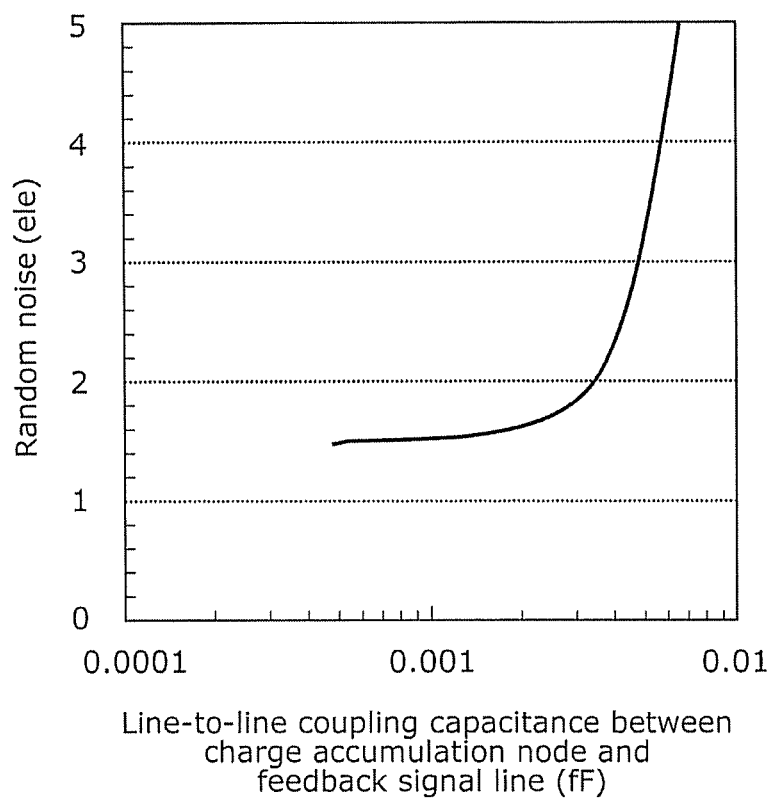
FIG. 4 illustrates a graph showing a relation between line-to-line coupling capacitance and random noise.

FIG. 4 illustrates a graph showing a relation between line-to-line coupling capacitance and random noise. This characteristic graph shows that how much random noise is left due to the line-to-line coupling capacitance between the charge accumulation node 25 and the feedback signal line 30 even when a feedback circuit is employed. A distance between the charge accumulation node 25 and the feedback signal line 30 decreases as the pixel is scaled down. The inventors have found that when the line-to-line coupling capacitance increases in response to this, the employment of the feedback circuit is not enough to completely cancel out the random noise. This is caused by an error due to feedback of the residual noise in the accumulation diode to a feedback voltage through the line-to-line coupling capacitance. FIG. 4 shows that in order to provide an image in which the random noise is suppressed to 2 ele (electrons), the line-to-line coupling capacitance must be 0.005 fF or less.

Figure 5:
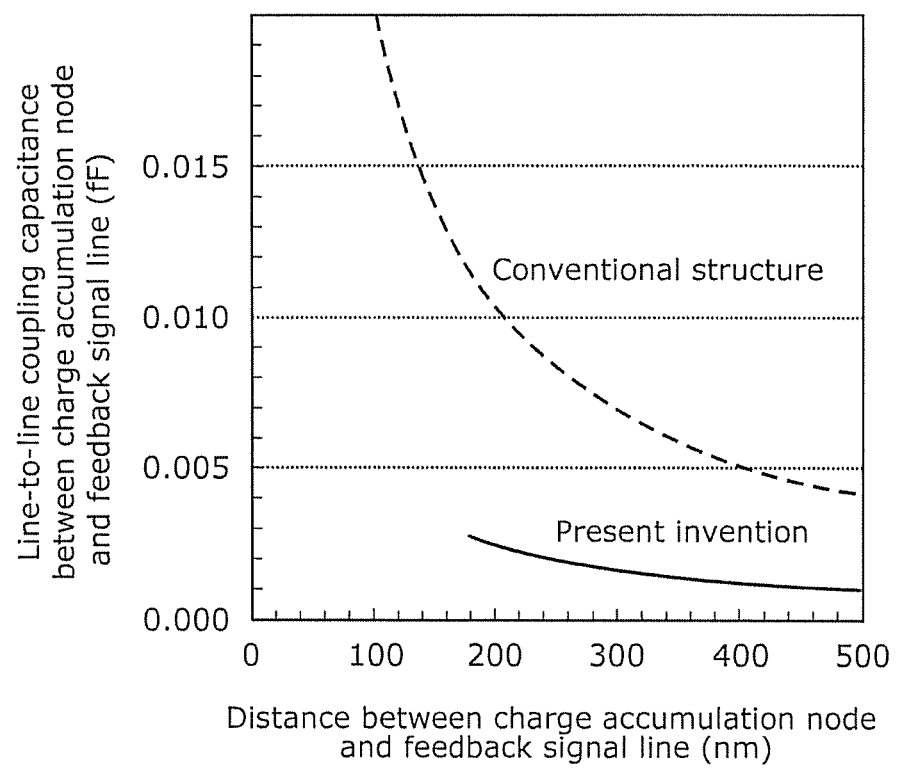
FIG. 5 illustrates a graph showing a relation between the line-to-line coupling capacitance and a distance between a charge accumulation node and a feedback signal line.

FIG. 5 illustrates a graph showing a relation between the line-to-line coupling capacitance and the distance between a charge accumulation node and a feedback signal line. The horizontal axis in FIG. 5 indicates the distance between the metal line 40 and the feedback signal line 30, and the vertical axis indicates the value of the line-to-line coupling capacitance. In FIG. 5, the solid line denotes data of the unit pixel 20 according to Embodiment 1, while the dashed line denotes data of the unit pixel 520 according to a comparison example.

In order to satisfy a reference value of 0.005 fF as shown in FIG. 4, the conventional unit pixel 520 must ensure that the distance between the metal line 40 and the feedback signal line 30 is 400 nm or more. In the solid-state imaging device requiring a unit pixel having a size less than 1.5 µm, such a layout is difficult.

In contrast, in the unit pixel 20 included in the solid-state imaging device 100 according to Embodiment 1, the vertical signal line 26 or the power line 27 is disposed between the metal line 40 and the feedback signal line 30, and thus the vertical signal line 26 or the power line 27 electrically shields the metal line 40 and the feedback signal line 30. Furthermore, the feedback signal line 30, the vertical signal line 26, and the power line 27 are arranged in parallel with one another in unit pixels 20. In this way, the feedback signal line 30 and the charge accumulation node 25 are uniformly, effectively, and electrically shielded by at least one of the vertical signal line 26 and the power line 27 in the pixel array including the unit pixels 20. Accordingly, even when the distance between the metal line 40 and the feedback signal line 30 is close to 200 nm, the line-to-line coupling capacitance of 0.005 fF or less can be adequately achieved. It is to be noted that in Embodiment 1, the distance between the metal line 40 and the feedback signal line 30 is approximately 200 nm, but which does not affect scaling down of the pixel size.

Furthermore, the feedback signal line 30 is formed in the second interconnect layer 7 which is one of interconnect layers stacked between the local line 4 and the photoelectric conversion element 24, starting from the second one of the interconnect layers from the local line 4. In this way, the feedback signal line 30 is not disposed in the first interconnect layer 6 close to the local line 4, so that it is possible to ensure a distance between the feedback signal line 30 and the local line 4 which is a part of the charge accumulation node 25. Accordingly, the coupling capacitance between the feedback signal line 30 and the charge accumulation node 25 can be reduced.

As described above, the solid-state imaging device 100 according to Embodiment 1 includes a unit pixel 20 in which the photoelectric conversion element 24 and a diffusion region of a transistor are connected with the charge accumulation node 25, the vertical signal line 26 which receives the pixel signal from the unit pixel 20, the power line 27 which provides a power supply voltage to the unit pixel 20, the feedback signal line 30 for the feedback of a voltage from the peripheral circuit to the unit pixel 20. In this solid-state imaging device 100, the vertical signal line 26 or the power line 27 is disposed between the metal line 40 and the feedback signal line 30 in the same layer.

With the foregoing structure, in the scaled-down unit pixel 20, at least one of the power line 27 and the vertical signal line 26, each of which is disposed between the charge accumulation node 25 and the feedback signal line 30 receiving the feedback signal, electrically shields the feedback signal line 30 and the charge accumulation node 25. In this way, the coupling capacitance between the metal line 40 and the charge accumulation node 25 can be reduced. Furthermore, even when the feedback signal line 30 and the charge accumulation node 25 are close to each other, the line-to-line coupling capacitance can be adequately minimized. Accordingly, the feedback error is suppressed, so that it is possible to cancel out the random noise at a high accuracy level.

In other words, the line-to-line coupling capacitance between the feedback signal line 30 and the metal line 40 can be reduced by avoiding any arrangement in which the feedback signal line 30 is directly adjacent to the metal line 40. In this way, even when the voltage of the feedback signal line changes for the feedback operation for the following rows after the end of the current feedback operation, it is possible to prevent an error caused by the change reflected into the charge accumulation node through the coupling capacitance. Accordingly, when the feedback circuit is employed in a fine pixel structure, the noise can be exactly cancelled out, and a low-noise image can be obtained.

It is to be noted that in Embodiment 1, a fine cell in which the line-to-line coupling capacitance is likely to be greater than the reference value (0.005 fF) is taken as an example, but this embodiment is applicable to a large pixel satisfying the reference value and thus effective to further improve its characteristics.

Embodiment 2

Figure 6:
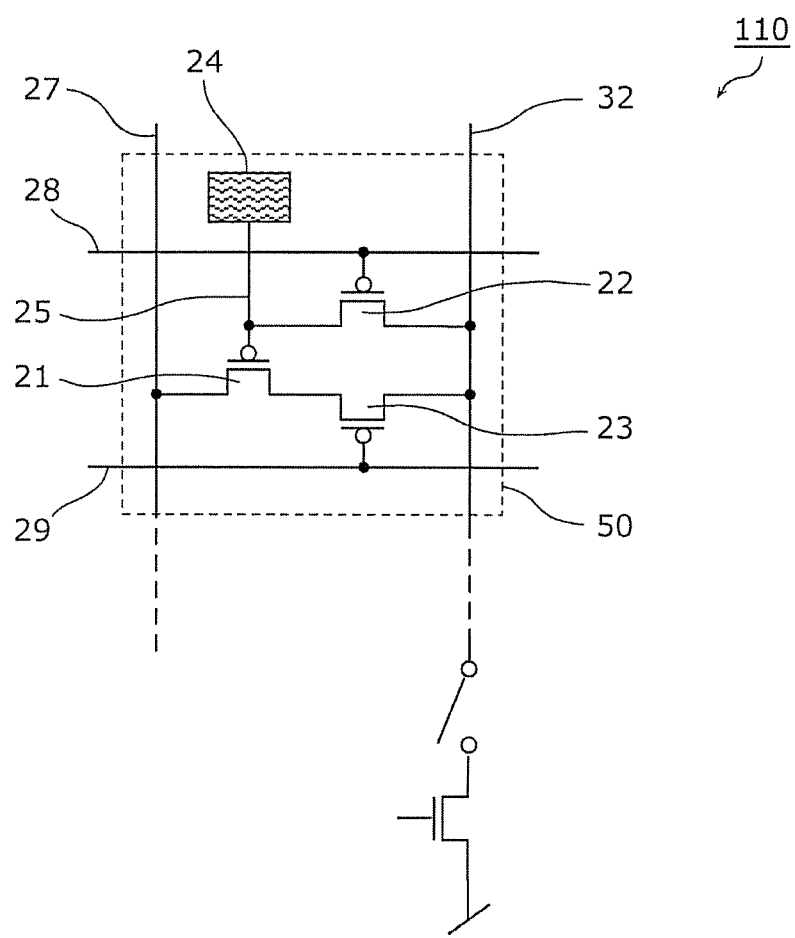
FIG. 6 illustrates a circuit structure of a solid-state imaging device according to Embodiment 2.
Figure 7:
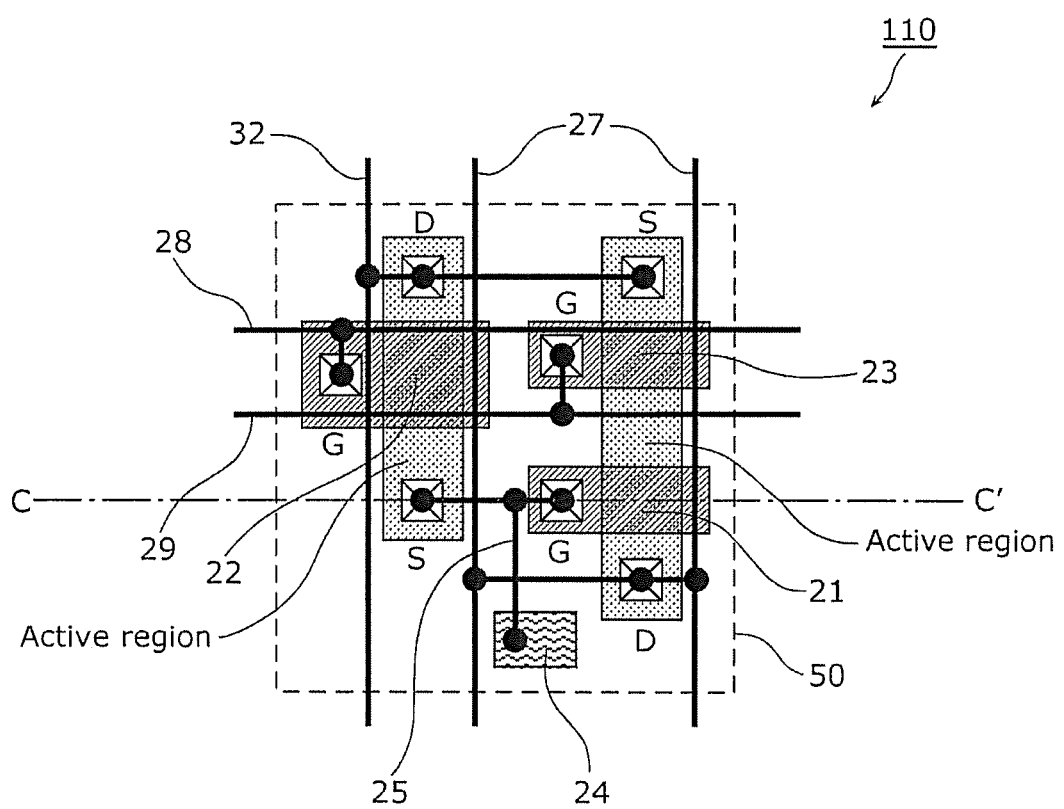
FIG. 7 illustrates a planar layout of a unit pixel of the solid-state imaging device according to Embodiment 2.

FIG. 6 illustrates a circuit structure of a solid-state imaging device according to Embodiment 2. Furthermore, FIG. 7 illustrates a planar layout of a unit pixel of the solid-state imaging device according to Embodiment 2.

The solid-state imaging device 110 according to Embodiment 2 includes a pixel array in which unit pixels 50 are arranged in columns and rows. The unit pixel 50 shown in FIG. 6 includes an amplifier transistor 21, a reset transistor 22, an address transistor 23, a photoelectric conversion element 24, and lines connecting them. The amplifier transistor 21 has a source connected to a power line 27 running vertically. The reset transistor 22 has a gate connected to a reset signal line 28 running horizontally, and a source connected to a vertical signal line 32 running vertically. The address transistor 23 has a gate connected to an address signal line 29 running horizontally, and a drain connected to the vertical signal line 32.

In the solid-state imaging device 100 according to Embodiment 1, the feedback signal line 30 is disposed separately from the vertical signal line 26, while in the solid-state imaging device 110 according to Embodiment 2, the vertical signal line 32 is also used as a feedback signal line for conveying a feedback signal and no feedback signal line exists. In Embodiment 1, random noise generated in the charge accumulation node 25 is reduced by negatively feeding back through the feedback amplifier 31 and the feedback signal line 30. In contrast, in Embodiment 2, the feedback amplifier is replaced with the amplifier transistor 21, the reset transistor 22, and the address transistor 23 in a pixel to achieve the feedback operation. The operating frequency is limited because the feedback operation is performed by in-pixel transistors with low drive power, but simplification of the circuit is the advantage of this embodiment.

Next, the layout in the unit pixel 50 according to Embodiment 2 is described. The unit pixel 50 differs from the unit pixel 20 according to Embodiment 1 in a line structure and a connecting method. As shown in FIG. 7, in the unit pixel 50, the feedback signal line 30 is omitted, and a vertical signal line 32 and two power lines 27 are vertically disposed. The vertical signal line 32 is provided for each column, and conveys a pixel signal to a peripheral circuit. The vertical signal line 32 also serves as a main signal line for conveying a feedback signal corresponding to the pixel signal to the unit pixel 50 belonging to the column. Like the source of the address transistor 23, the drain of the reset transistor 22 is connected to the vertical signal line 32. The unit pixel 50 according to Embodiment 2 can prevent an increase in the line-to-line coupling capacitance between the charge accumulation node 25 and the vertical signal line 32 conveying the feedback signal by interposing the charge accumulation node 25 between the two power lines 27.

A cross-section structure of the foregoing pixel layout is described with reference to FIG. 8A.

Figure 8A:
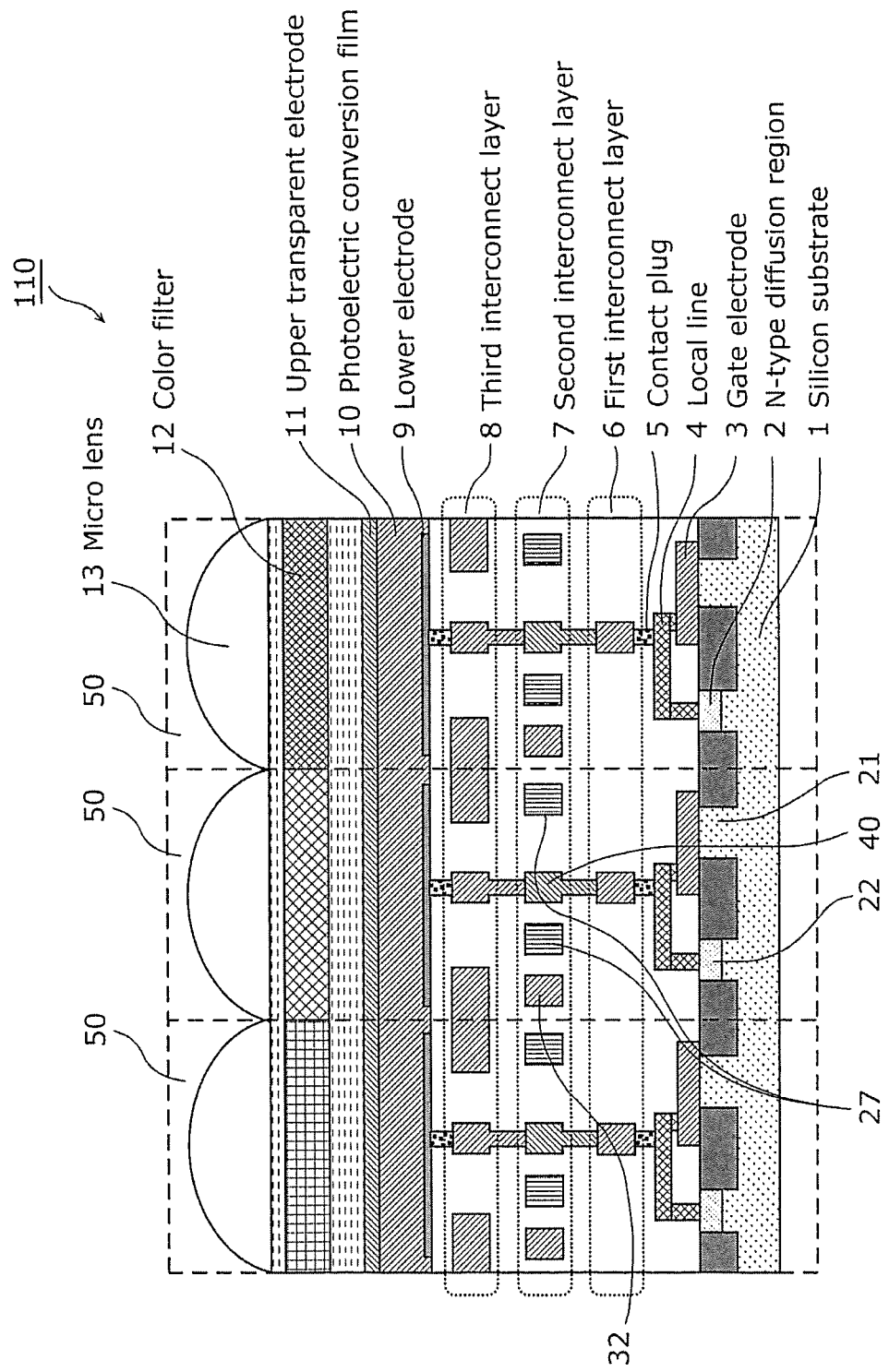
FIG. 8A illustrates a cross-sectional view of a pixel array in the solid-state imaging device according to Embodiment 2.

FIG. 8A illustrates a sectional view of a pixel array in the solid-state imaging device according to Embodiment 2. FIG. 8A illustrates a cross-sectional view of the planar layout in FIG. 7 along the line C-C'. The vertical signal line 32 and the metal line 40 are electrically shielded by the two power lines 27 disposed in the second interconnect layer 7. In other words, the vertical signal line 32, the metal line 40 which is a part of the charge accumulation node 25, and the power line 27 are disposed in the same second interconnect layer 7, and the power line 27 is disposed between the vertical signal line 32 and the metal line 40.

With the foregoing structure, in the scaled-down unit pixel 50, the power line 27 disposed between the metal line 40 and the vertical signal line 32 receiving the feedback signal electrically shields the vertical signal line 32 and the charge accumulation node 25. In this way, the coupling capacitance between the vertical signal line 32 and the charge accumulation node 25 can be reduced. Furthermore, even when the vertical signal line 32 and the metal line 40 are close to each other, an adequate small line-to-line coupling capacitance can be achieved. Accordingly, the feedback error is suppressed, so that it is possible to cancel out the random noise at a high accuracy level. Furthermore, the feedback signal line dedicated to convey the feedback signal is omitted, so that it is possible to simplify the pixel circuit and facilitate an increase in the number of pixels.

Furthermore, the vertical signal line 32 and the power line 27 are arranged in parallel with each other in unit pixels 50. In this way, the vertical signal line 32 and the charge accumulation node 25 are uniformly, effectively, and electrically shielded by the power line 27 in the pixel array including the unit pixels 50.

Furthermore, the vertical signal line 32 is disposed in the second interconnect layer 7 which is one of interconnect layers stacked between the local line 4 and the photoelectric conversion element 24, starting from the second one of the interconnect layers from the local line 4. In this way, the vertical signal line 32 is not disposed in the first interconnect layer 6 close to the local line 4, so that it is possible to ensure a distance between the vertical signal line 32 and the local line 4 which is a part of the charge accumulation node 25. Accordingly, the coupling capacitance between the vertical signal line 32 and the charge accumulation node 25 can be reduced.

Figure 8B:
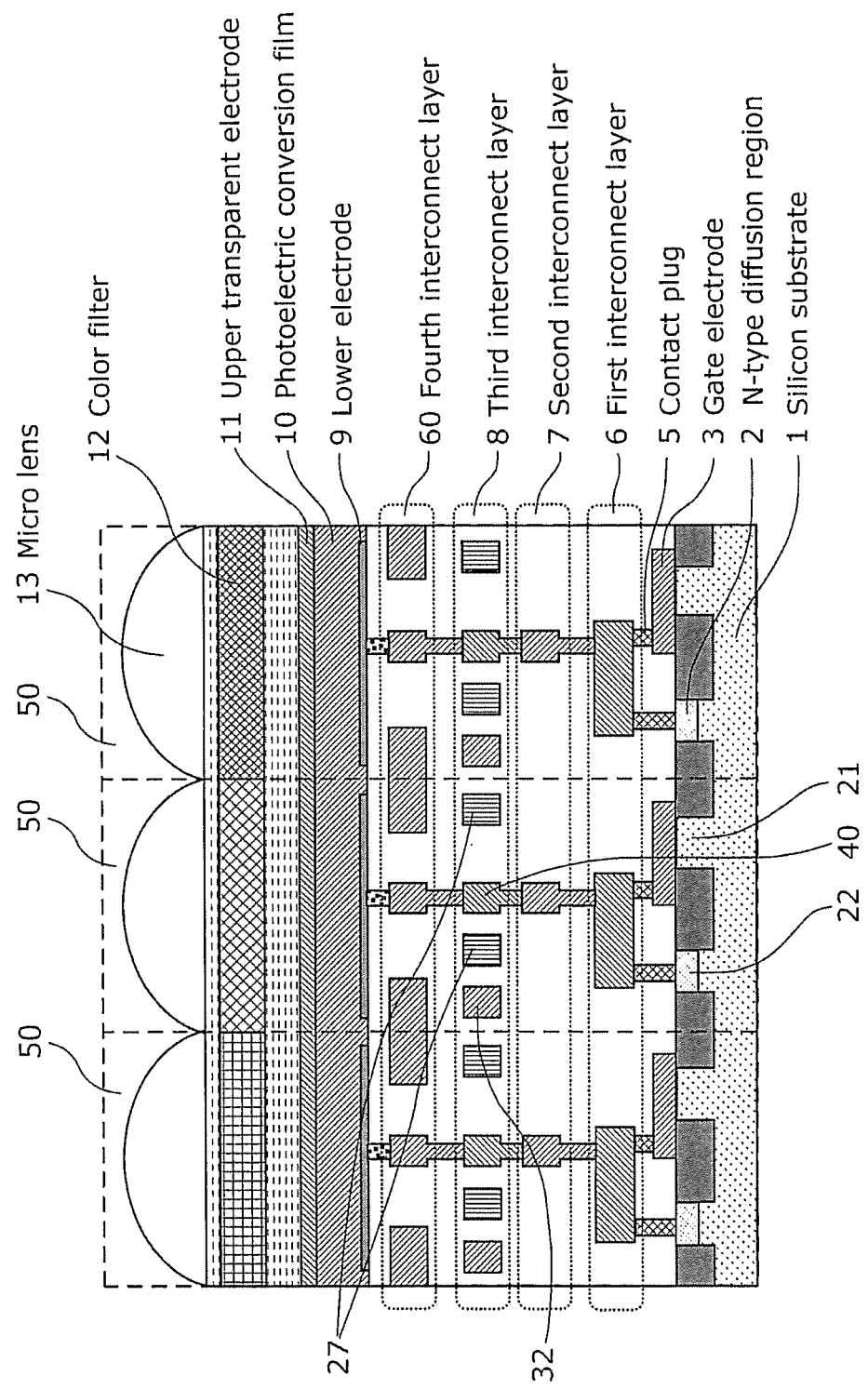
FIG. 8B illustrates a first variation of the cross-sectional view of the pixel array in the solid-state imaging device according to Embodiment 2.
Figure 8C:
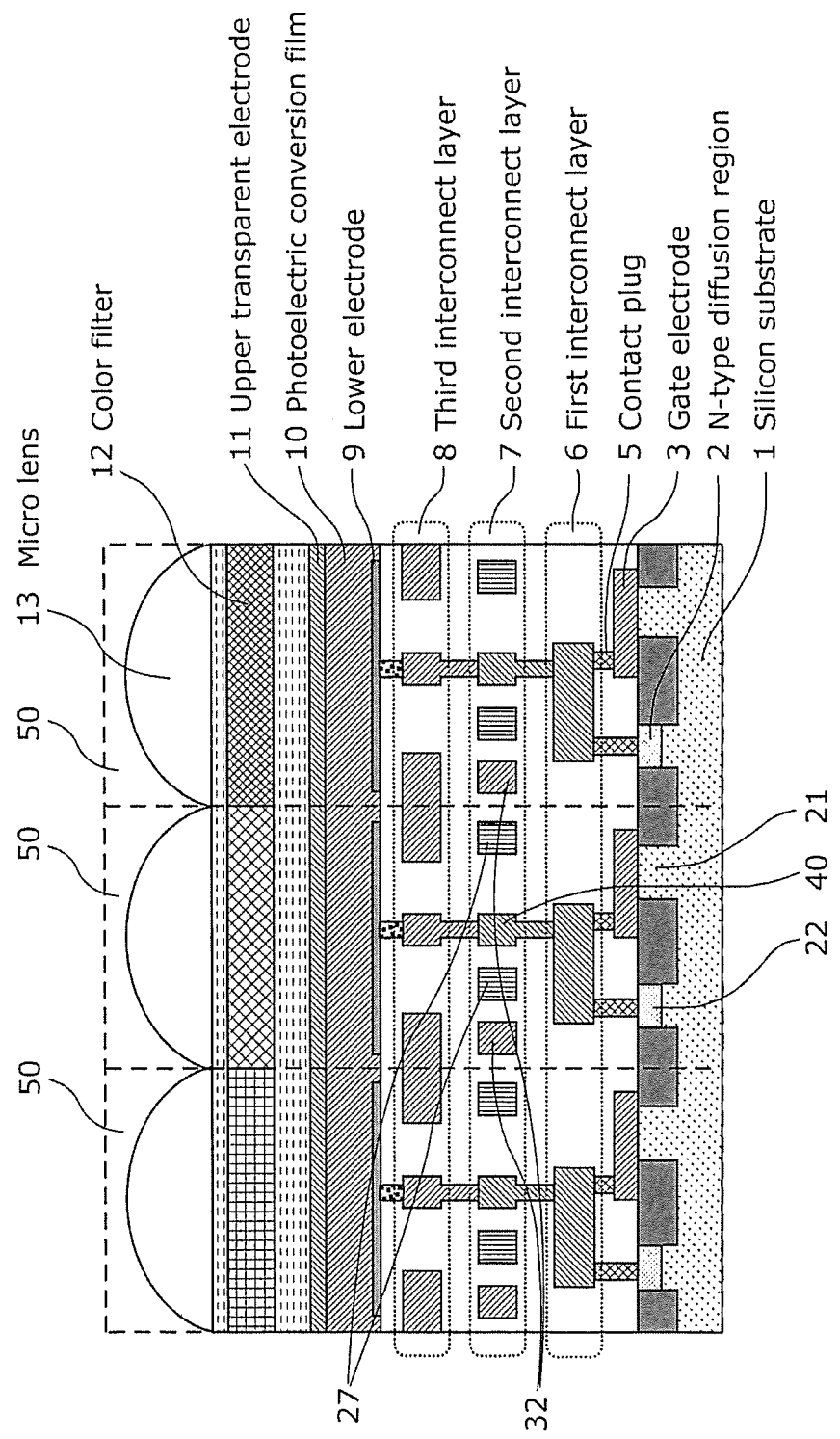
FIG. 8C illustrates a second variation of the cross-sectional view of the pixel array in the solid-state imaging device according to Embodiment 2.

It is to be noted that, in FIG. 8A according to Embodiment 2, an n-type polysilicon local line 4 is used to connect the gate electrode 3 of the amplifier transistor 21 and the source of the reset transistor 22. The local line 4 is made of the n-type polysilicon because the local line 4 is provided in the pixel and it does not matter how high the line resistance is. In contrast, like Embodiment 1, when priority is given to the line resistance issue, as shown in FIG. 8B illustrating the first variation of Embodiment 2, or FIG. 8C illustrating the second variation of Embodiment 2, Cu interconnect layers are increased in the same manner as the upper interconnect layers, and the lowest first interconnect layer 6 may be used as a line connecting the gate electrode 3 of the amplifier transistor 21 and the source of the reset transistor 22. In the structure of FIG. 8B, four interconnect layers including the fourth interconnect layer 60 are provided between the diffusion layer and the photoelectric conversion element. Furthermore, in the structure of FIG. 8C, the line and the vertical signal line 32 are disposed in interconnect layers stacked between the diffusion layer and the photoelectric conversion element.

As described above, in the solid-state imaging device 110 according to Embodiment 2, the vertical signal line 32 has a role to convey the feedback signal. In this case, the power line 27 is disposed between the metal line 40 and the vertical signal line 32 in the same layer, so that it is possible to considerably reduce the line-to-line coupling capacitance between the metal line 40 and the vertical signal line 32.

As described above, the solid-state imaging device disclosed herein have been described based on Embodiments 1 and 2, but is not limited to Embodiments 1 and 2. Those skilled in the art will be readily appreciated that various modifications and combinations of the structural elements are possible in the exemplary embodiments without departing from the scope of the present invention. Such modifications and combinations are also embodiments of the present disclosure. For example, an imaging device (a camera) in which the solid-state imaging device according to the present disclosure is embedded is also included in the present invention.

Figure 11:
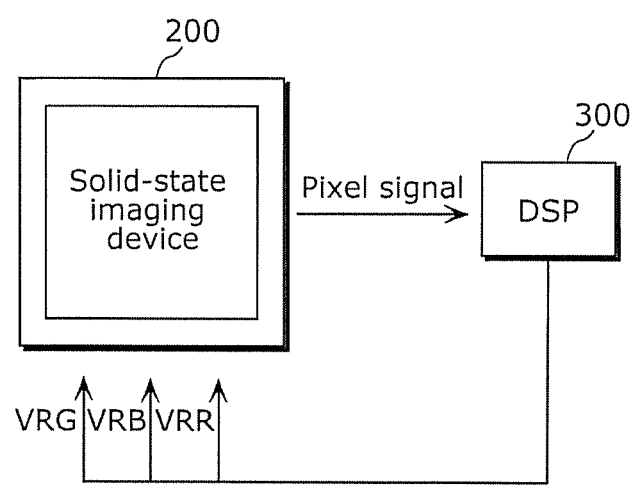
FIG. 11 illustrates a function block diagram of an imaging device including the solid-state imaging device according to Embodiment 1 or Embodiment 2.

FIG. 11 illustrates a function block diagram of an imaging device including the solid-state imaging device according to Embodiment 1 or Embodiment 2. The imaging device shown in FIG. 11 includes a solid-state imaging device 200 and a digital signal processor (DSP) 300.

The solid-state imaging device 200 is the solid-state imaging device 100 or 110 according to Embodiment 1 or 2, and, for example, includes: a vertical scan circuit for selecting, on a row-by-row basis, unit pixels 20 or 50 from among unit pixels arranged in a matrix to control the reading out or resetting of the pixels; a column analog-to-digital (A/D) circuit for performing A/D conversion of pixel signals read out from the unit pixels; and a horizontal scan circuit for activating the reading out of the converted digital pixel signals.

The DSP 300 serves as a DSP or the like which receives the digital pixel signal provided from the solid-state imaging device 200 and performs camera signal processing such as gamma correction, color interpolation, spatial interpolation, or auto white balance. Furthermore, the DSP 300 also serves as a microcomputer or the like which controls the solid-state imaging device 200 according to various settings specified by a user to integrate all operations of the imaging device. The signal provided from the solid-state imaging device 200 serving as an image sensor is used in the DSP 300 to calculate optimum reset voltages (VRG, VRB, VRR), and the optimum reset voltages are fed back to the solid-state imaging device 200. It is to be noted that the reset voltage may be the feedback signal conveyed by the feedback signal line 30 or the vertical signal line 32. The solid-state imaging device 200 and the DSP 300 may be manufactured as a single semiconductor device, so that it is possible to miniaturize an electric device including the solid-state imaging device 200.

As to the imaging device provided with this solid-state imaging device 200, in the scaled-down pixel, at least one of the power line and the main signal line, each of which is disposed between the charge accumulation node and the feedback signal line receiving the feedback signal, electrically shields the feedback signal line and the charge accumulation node. Alternatively, in the scaled-down pixel, the power line disposed between the charge accumulation node and the main signal line receiving the feedback signal electrically shields the main signal line and the charge accumulation node. In this way, the coupling capacitance between the feedback signal line and the charge accumulation node or between the main signal line and the charge accumulation node can be reduced. Accordingly, the feedback error is suppressed, so that it is possible to cancel out the random noise at a high accuracy level and obtain a high-quality video.

It is to be noted that, in the solid-state imaging device 100 or 110 according to Embodiment 1 or 2, each unit pixel 20 or 50 includes one photoelectric conversion element, one address transistor, one charge accumulation node, one reset transistor, and one amplifier transistor. This means that one cell is composed of one pixel. However, the solid-state imaging device disclosed herein may have another structure. For example, in a unit cell, plural photoelectric conversion elements are included, and further any or all of the charge accumulation node, the reset transistor, and the amplifier transistor may be shared. This means that one cell is composed of plural pixels.

Furthermore, in Embodiments 1 and 2, a p-type MOS transistor is used as an example, but any other MOS transistor may be employed. For example, an n-type MOS transistor is possible.

It is to be noted that the present disclosure is particularly effective for a fine cell, but also effective for a large pixel such as a size of over 3 μm to further improve its characteristics.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

One or more exemplary embodiments disclosed herein are useful particularly for digital still cameras or video cameras, and suitable for use in solid-state imaging devices and cameras requiring high-definition and high-quality still images and/or smooth video display.

The invention claimed is:

1. A solid-state imaging device comprising:
pixels arranged in columns and rows;
a first line to which a power supply voltage is supplied; and
a second line through which a signal is transmitted, wherein
each of the pixels includes:
a photoelectric converter converting the incident light into charge; and
an amplifier transistor a gate of which is electrically connected to the photoelectric converter through a third line,
the first line, the second line, and the third line are in a same layer among layers of the solid-state imaging device,
the second line, the first line, and the third line are arranged in line with a row direction of the pixels in this order, and
the first and second lines extend in a column direction.

2. The solid-state imaging device according to claim 1, wherein
the first line is directly adjacent to the third line, and
the first line is directly adjacent to the second line.

3. The solid-state imaging device according to claim 1, wherein
each of the pixels in the one of the columns further includes:
a reset transistor resetting the charge of the gate terminal of the amplifier transistor;
a diffusion layer in the reset transistor;
a fourth line connecting the gate terminal of the amplifier transistor and the diffusion layer; and
interconnecting layers stacked between the fourth line and the photoelectric converter, and
the second line, electrically connected to the reset transistor, is disposed in any of the interconnecting layers except one of the interconnecting layers immediately adjacent to the fourth line.

4. The solid-state imaging device according to claim 1, wherein
each of the pixels in the one of the columns further includes:
a reset transistor resetting the charge of the gate terminal of the amplifier transistor;
a diffusion layer in the reset transistor;
a fourth line connecting the gate terminal of the amplifier transistor and the diffusion layer, and
interconnecting layers stacked between the diffusion layer and the photoelectric converter, wherein
the fourth line and the second line are disposed in the interconnecting layers, and
the second line is electrically connected to the reset transistor.

5. The solid-state imaging device according to claim 1, wherein
the first line includes a plurality of first lines, and
the second line includes a plurality of second lines,
one of the first lines, one of the second lines, and the third line are in the same layer, and the third line is directly adjacent to the one of the second lines.

6. The solid-state imaging device according to claim 1, wherein
each of the pixels in the one of the columns further includes a reset transistor resetting the charge of the gate terminal of the amplifier transistor, and
the signal transmitting through the second line is a reset signal supplied to the reset transistor.

7. A solid-state imaging device comprising:
pixels arranged in columns and rows, each of the pixels generating a pixel signal according to incident light;
a first line through which the pixel signal is transmitted; and
a second line to which a power supply voltage is supplied, wherein
each of the pixels includes:
a photoelectric converter converting the incident light into charge; and
an amplifier transistor a gate of which is electrically connected to the photoelectric converter through a third line,
the first line, the second line, and the third line are in a same layer among layers of the solid-state imaging device,
the first line, the third line, and the second line are arranged in line with a row direction of the pixels in this order, and
the first and second lines extend in a column direction.

8. The solid-state imaging device according to claim 7, wherein
the first line is directly adjacent to the third line, and
the second line is directly adjacent to the third line.

9. The solid-state imaging device according to claim 7, further comprising a fourth line through which a feedback signal is transmitted from the peripheral circuit to one of the pixels, wherein
the first line, the second line, the third line, and the fourth lines are in the same layer.

10. The solid-state imaging device according to claim 9, wherein
each of the pixels further includes:
a reset transistor resetting the charge of the gate terminal of the amplifier transistor;
a diffusion layer in the reset transistor;
a fifth line connecting the gate terminal of the amplifier transistor and the diffusion layer; and
interconnecting layers stacked between the fifth line and the photoelectric converter, and
the fourth line, electrically connected to the reset transistor, is disposed in any of the interconnecting layers except one of the interconnecting layers immediately adjacent to the fifth line.

11. The solid-state imaging device according to claim 9, wherein
each of the pixels further includes:
a reset transistor resetting the charge of the gate terminal of the amplifier transistor;
a diffusion layer in the reset transistor;
a fifth line connecting the gate terminal of the amplifier transistor and the diffusion layer; and
interconnecting layers stacked between the diffusion layer and the photoelectric converter, wherein
the fifth line and the fourth line are disposed in the interconnecting layers.

12. The solid-state imaging device according to claim 10, wherein
the first line includes a plurality of first lines,
the second line includes a plurality of second lines,
the fourth lines includes a plurality of fourth lines,
one of the first lines, one of the second lines, the third line, and one of the fourth lines are in the same layer, and
the third line is directly adjacent to one of the first lines.

* * * * *